(12) United States Patent
Kurosaki

(10) Patent No.: US 6,545,919 B1
(45) Date of Patent: Apr. 8, 2003

(54) SEMICONDUCTOR MEMORY AND OUTPUT SIGNAL CONTROL METHOD AND CIRCUIT IN SEMICONDUCTOR MEMORY

(75) Inventor: Kazuhide Kurosaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/452,718

(22) Filed: Dec. 3, 1999

(30) Foreign Application Priority Data

Dec. 28, 1998 (JP) .................................... 10-371902

(51) Int. Cl.[7] ................................................ G11C 7/00
(52) U.S. Cl. .................... 365/195; 365/194; 365/189.5; 365/233.5
(58) Field of Search .................... 365/195, 189.05, 365/194, 189.01, 233.5

(56) References Cited

U.S. PATENT DOCUMENTS

| | | | |
|---|---|---|---|
| 5,295,117 A | | 3/1994 | Okada |
| 5,414,672 A | * | 5/1995 | Ozeki et al. .............. 365/233.5 |
| 5,608,688 A | * | 3/1997 | Park ........................ 365/233.5 |
| 5,729,502 A | * | 3/1998 | Furutani et al. ............ 365/233 |
| 5,796,661 A | * | 8/1998 | Kim ....................... 365/189.05 |

FOREIGN PATENT DOCUMENTS

| | | |
|---|---|---|
| JP | 1-173387 | 7/1989 |
| JP | 5-54681 | 3/1993 |
| JP | 8-63970 | 3/1996 |
| TW | 328601 | 3/1998 |

* cited by examiner

*Primary Examiner*—Hoai Ho
(74) *Attorney, Agent, or Firm*—Arent Fox Kintner Plotkin & Kahn, PLLC

(57) ABSTRACT

A signal delay circuit (100) is provided for inhibiting an output control signal (/OE), which is externally input, from transferring to an output buffer (6) for a predetermined period after an address changes. While a sense amplifier (1) senses data in the predetermined period after the address changes, the logic level of a signal (OUT) output from the output buffer (6) is inhibited from being inverted. This prevents any malfunction caused by output noise generated during the data sense operation of the sense amplifier (1).

13 Claims, 13 Drawing Sheets

FIRST EMBODIMENT OF OUTPUT CONTROL CIRCUIT

TIMING CHART OF CIRCUIT ACCORDING TO
FIRST PRIOR ART

BLOCK DIAGRAM SHOWING SECOND PRIOR ART

TIMING CHART OF CIRCUIT ACCORDING TO SECOND PRIOR ART

FIG. 5 FIRST EMBODIMENT OF OUTPUT CONTROL CIRCUIT

TIMING CHART OF OUTPUT CONTROL CIRCUIT
ACCORDING TO FIRST EMBODIMENT

SECOND EMBODIMENT OF OUTPUT CONTROL CIRCUIT

TIMING CHART OF OUTPUT CONTROL CIRCUIT
ACCORDING TO SECOND EMBODIMENT

FIG. 9 — THIRD EMBODIMENT OF OUTPUT CONTROL CIRCUIT

FIRST EMBODIMENT OF SEMICONDUCTOR MEMORY

TIMING CHART OF OUTPUT CONTROL CIRCUIT
ACCORDING TO FOURTH EMBODIMENT

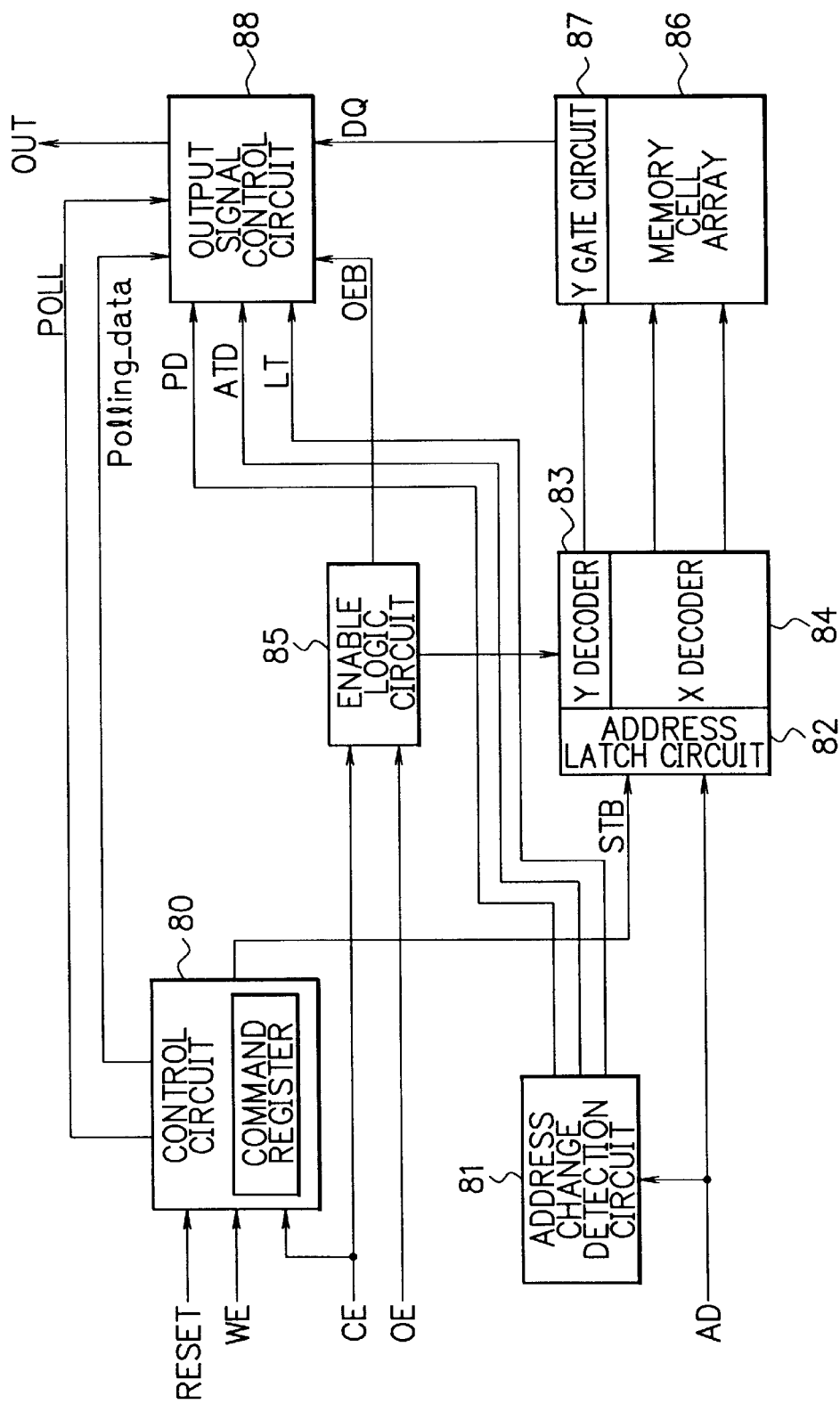

SEMICONDUCTOR MEMORY AND OUTPUT SIGNAL CONTROL METHOD AND CIRCUIT IN SEMICONDUCTOR MEMORY

BACKGROUND OF THE INVENTION

1. Field of the Invention

The present invention relates to a semiconductor memory and an output signal control method and circuit in the semiconductor memory and, more particularly, to a semiconductor memory and an output signal control method and circuit in the semiconductor memory that are preferably used to prevent generation of output noise in the semiconductor memory.

2. Description of the Related Art

In a data read, a semiconductor memory including a nonvolatile semiconductor memory generally amplifies a small current flowing from a memory cell by a sense amplifier, and outputs data stored in the memory cell as an "H"- or "L"-level electrical signal through an output buffer.

FIG. 1 is a block diagram showing the first prior art of an output control circuit for controlling transfer of a signal output from a sense amplifier to an output buffer. As shown in FIG. 1, a signal output via a sense amplifier 1 through a bit line connected to a memory cell is supplied via a switching transistor 2 to a latch circuit 5 which is made up of inverters 3 and 4 and constitutes output latch unit.

The signal latched by the latch circuit 5 is supplied as data DATA to an output buffer 6. When the output buffer 6 is in an enable state, the data DATA is output as an output signal OUT through a CMOS inverter 7 made up of a p-channel transistor and n-channel transistor.

An output control signal /OE which is externally input via a control signal input terminal /OE_pin is supplied as an output buffer control signal OEB to the output buffer 6 via a control input buffer 11. When this output buffer control signal OEB is at "L" level, the output buffer 6 is in an enable state.

The operation of the conventional output signal control circuit having this arrangement will be described with reference to the timing chart of FIG. 2.

When an address AD changes, as shown in FIG. 2, this change is detected by an address change detection circuit (not shown), an address change detection signal ATD changes to "H" level for a predetermined period, and an output from a cell corresponding to the new address connected to a bit line is sensed. When the address change detection signal ATD changes to "H" level, a sense amplifier operation signal PD supplied to the sense amplifier 1 changes from "H" level to "L" level, and the sense amplifier 1 performs data sense operation.

When the address change detection signal ATD changes to "L" level, the address change detection circuit outputs a sense data reception signal LT and supplies it to the switching transistor 2. At this time, the sense amplifier operation signal PD changes to "H" level.

Upon receiving the sense data reception signal LT, the switching transistor 2 is turned on. The sense data DATA of the sense amplifier 1 is latched by the latch circuit 5 and supplied to the output buffer 6. The sense data DATA supplied to the output buffer 6 is output to the outside as the output signal OUT via the CMOS inverter 7.

As described above, the output buffer 6 is in an enable state when the output buffer control signal OEB supplied to its control input terminal is at "L" logic level.

The output buffer control signal OEB supplied to the output buffer 6 is in phase with the output control signal /OE which is externally input via the control signal input terminal /OE_pin. Hence, as shown in FIG. 2, the output buffer 6 changes to an enable state during data sense operation of the sense amplifier 1 ("H"-level period of the address change detection signal ATD) depending on the timing at which the output control signal /OE is externally supplied.

In this output signal control circuit, a transistor constituting the output buffer 6 has a high driving capability in order to drive an external load. If the level of the output signal OUT is inverted, the power supply potential varies. If the output signal OUT is inverted during data sense operation of the sense amplifier 1 to vary the power supply potential, large output noise is generated to destroy sense data owing to the malfunction of the sense amplifier 1 or the like. As a result, erroneous data is undesirably latched by the latch circuit 5.

In a flash memory for performing automatic algorithm operation of a write/erase, data to be output to the output buffer is switched from polling data to read data by switching the address from a given block to another block in a suspend read performed during automatic algorithm operation. At this time, if polling data and read data are switched during data sense operation of the sense amplifier 1, output noise is generated by variations in power supply potential.

FIG. 3 is a block diagram showing the second prior art, and shows the arrangement of an output signal control circuit in a flash memory. In FIG. 3, the same reference numerals as in FIG. 1 denote the same parts as in FIG. 1, and a detailed description thereof will be omitted.

In the circuit of FIG. 3, a second switching transistor 70 is interposed between a latch circuit 5 and an output buffer 6. Polling data is supplied between the second switching transistor 70 and output buffer 6 via a transistor 68. An operation switching signal POLL is supplied to the gate of the transistor 68, whereas the inverted signal of the operation switching signal POLL is supplied to the gate of the second switching transistor 70 via the inverter 69.

In the circuit of FIG. 3 having this arrangement, while the address change detection signal ATD is at "H" level, the operation switching signal POLL falls to "L" level during data sense amplifier of a sense amplifier 1, as shown in the timing chart of FIG. 4. Then, the transistor 68 is turned off to stop outputting polling data. The transistor 70 is turned on to supply an output from the sense amplifier 1 to the output buffer 6. Similarly to the first prior art, the output signal OUT is inverted during data sense operation of the sense amplifier 1, and the power supply potential varies to generate output noise. Consequently, erroneous data is undesirably latched.

In any case, in the conventional circuit, if the level of the output signal OUT from the output buffer 6 varies during sense operation of the sense amplifier 1, output noise generated by variations in power supply voltage destroys the sense data DATA of the sense amplifier 1.

To prevent the malfunction of the sense amplifier 1 under the influence of the above-described output noise, the techniques disclosed in Japanese Patent Application Laid-Open Nos. 54681/1993, 63970/1996, and 173387/1989 have conventionally been proposed.

In a "semiconductor memory" disclosed in Japanese Patent Application Laid-Open No. 54681/1993, a transistor which is set off for a predetermined time corresponding to an address change is interposed between the power supply and the output point of a sense amplifier circuit. In switching the address, the output level of the sense amplifier circuit is reduced to prevent output of erroneous data even if a memory cell is erroneously selected.

In a "semiconductor memory" disclosed in Japanese Patent Application Laid-Open No. 63970/1996, when output data from a sense amplifier changes, an output from the sense amplifier is disabled before an output from an output buffer is inverted. After the output from the sense amplifier is stabilized, the output from the output buffer is inverted. Variations in power supply potential by inversion operation of the output buffer hardly influences the operation of the sense amplifier. This prevents the malfunction of the sense amplifier under the influence of inversion operation of the output buffer.

In a "semiconductor integrated circuit" disclosed in Japanese Patent Application Laid-Open No. 173387/1989, the output time of data from a sense amplifier to an output buffer is set short until a memory cell is newly selected to output data from the output buffer after the address changes. After that, the output time is set long. This prevents output of erroneous data even if the sense amplifier or address buffer malfunctions under the influence of power supply noise generated upon outputting data to the output buffer.

In the prior art disclosed in each reference, data transferred from the sense amplifier to the output buffer is delayed by a predetermined time to reduce the influence of output noise generated when an output signal is inverted during data sense operation of the sense amplifier.

More specifically, the prior art prevents the malfunction of the sense amplifier owing to output noise generated when an output from the output buffer changes during sense operation of the sense amplifier. However, the power supply voltage varies during data sense operation of the sense amplifier depending on the timing at which the output control signal /OE is externally supplied, or the timing at which the operation switching signal POLL is supplied. The malfunction of the sense amplifier caused by variations in power supply voltage cannot be fundamentally prevented.

SUMMARY OF THE INVENTION

The present invention has been made to overcome the conventional drawbacks, and aims to prevent variations in level of a signal output from an output buffer during data sense operation of a sense amplifier, so as reliably to prevent erroneous data from being output owing to output noise generated by variations in power supply potential during data sense operation of the sense amplifier.

To achieve the above object, according to the present invention, there is provided a semiconductor memory comprising delay unit for inhibiting an output control signal, which is externally input to control the operation of an output buffer, from being transferred to said output buffer for a predetermined period after an address is changed.

According to another aspect of the present invention, there is provided a semiconductor memory including a sense amplifier and output latch unit for latching data detected by said sense amplifier, said memory comprising delay unit for inhibiting an output control signal, which is externally input to enable an output buffer, from being transferred to said output buffer until an output from said sense amplifier is received by said output latch unit.

According to still another aspect of the present invention, there is provided a semiconductor memory wherein polling data and read data are selectively switched by a polling signal and output via an output buffer in an automatic algorithm operation of a write/erase, said memory comprising delay unit for delaying data-switching based on the polling signal by a predetermined period.

According to still another aspect of the present invention, there is provided a semiconductor memory to operate by an automatic algorithm of a write/erase, comprising delay unit for delaying switching from polling data to read data while a sense amplifier performs a data sense operation in switching data from polling data to read data to be transferred to an output buffer by changing an address from a given block to another block in a suspend read performed in operating by said automatic algorithm.

According to still another aspect of the present invention, there is provided an output signal control method in a semiconductor memory, comprising the step of delaying a signal so as to inhibit an output control signal, which is externally input to control the operation of an output buffer, from being transferred to said output buffer for a predetermined period after an address is changed.

According to still another aspect of the present invention, there is provided an output signal control method in a semiconductor memory wherein polling data and read data are selectively switched by a polling signal and output via an output buffer in operating by an automatic algorithm of a write/erase, said method comprising the step of delaying data-switching based on said polling signal by a predetermined period.

According to still another aspect of the present invention, there is provided an output signal control circuit for inhibiting an output control signal, which is externally input to control the operation of an output buffer, from being transferred to said output buffer for a predetermined period after an address is changed.

According to still another aspect of the present invention, there is provided an output signal control circuit comprising delay unit for inhibiting an output control signal, which is externally input to enable an output buffer, from being transferred to said output buffer until data detected by a sense amplifier is received by output latch unit.

According to still another aspect of the present invention, there is provided an output signal control circuit wherein polling data and read data are selectively switched by a polling signal and output via an output buffer in a semiconductor memory operating by an automatic algorithm of a write/erase, said circuit comprising delay unit for delaying data-switching based on said polling signal by a predetermined period.

Even if an output control signal for activating an output buffer is externally input, the present invention having the above arrangement can keep the output buffer off for a predetermined period after the address is switched. The present invention can reliably prevent a change in logic level of the output signal owing to the output buffer changing to an enable state during a data sense operation of a sense amplifier. This can fundamentally solve the problem that output noise due to variations in power supply voltage during the sense operation of the sense amplifier is generated during the data sense operation of the sense amplifier, the sense amplifier senses erroneous data owing to a malfunction or the like, and the erroneous data is latched by the data latch circuit.

In addition, data-switching based on a polling signal in an automatic algorithm operation of a write/erase is delayed by a predetermined period. While the sense amplifier senses data, switching from polling data to read data can be inhibited effectively to prevent a malfunction caused by output-switching performed in the automatic algorithm operation.

BRIEF DESCRIPTION OF THE DRAWINGS

FIG. 13 is a block diagram showing the second embodiment of a semiconductor memory according to the present invention.

DETAILED DESCRIPTION OF THE PREFERRED EMBODIMENTS

Preferred embodiments of a semiconductor memory and an output signal control method and circuit in the semiconductor memory according to the present invention will be described below with reference to the accompanying drawings.

Figure 1:
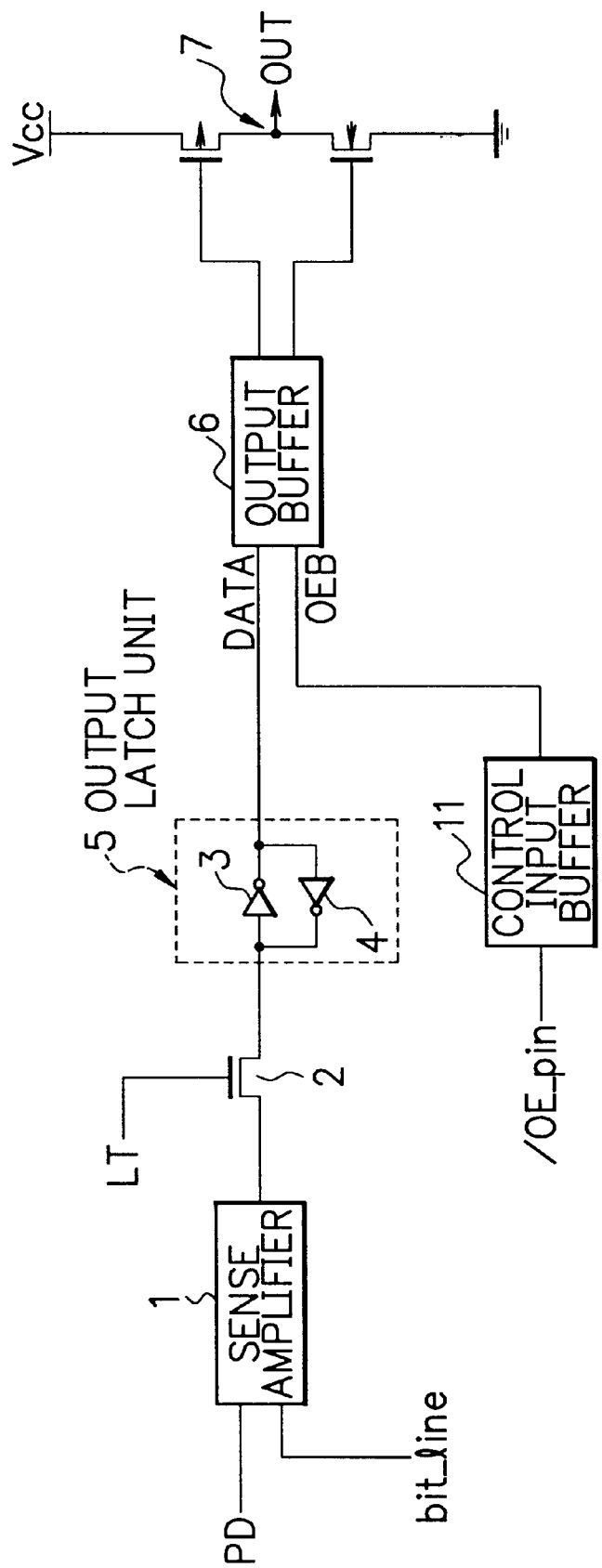
FIG. 1 is a block diagram showing the first prior art of an output signal control circuit.
Figure 2:
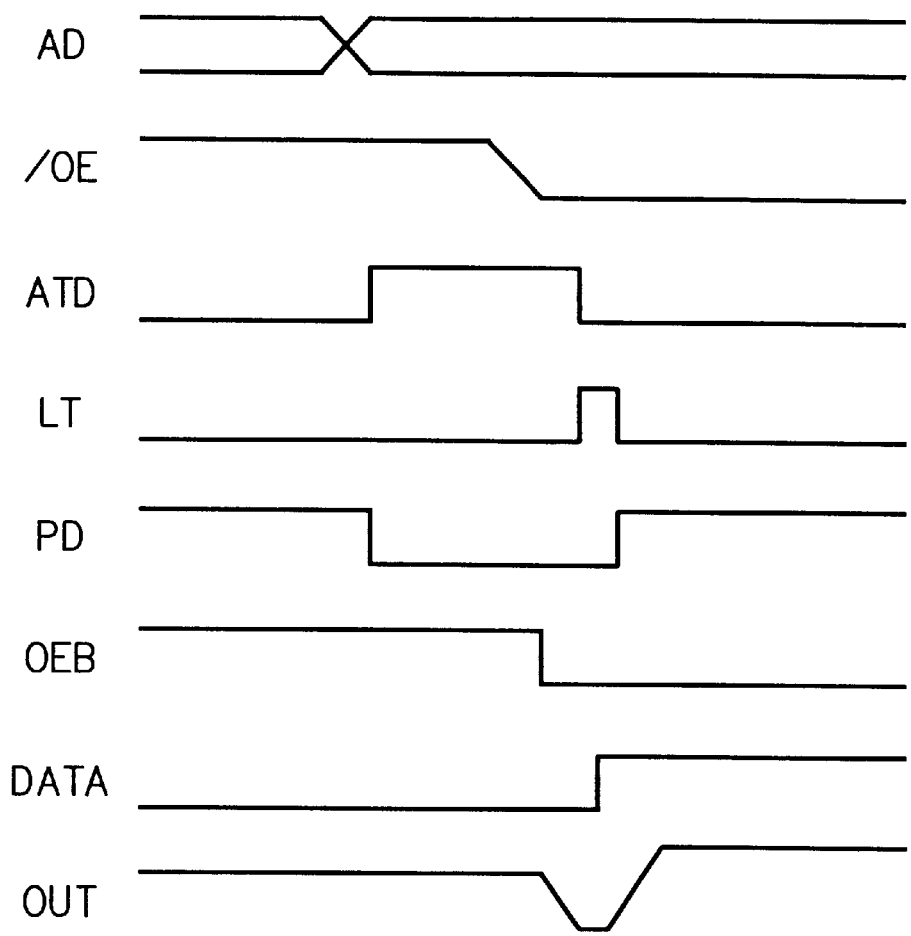
FIG. 2 is a timing chart showing the operation of the output signal control circuit according to the first prior art.
Figure 5:
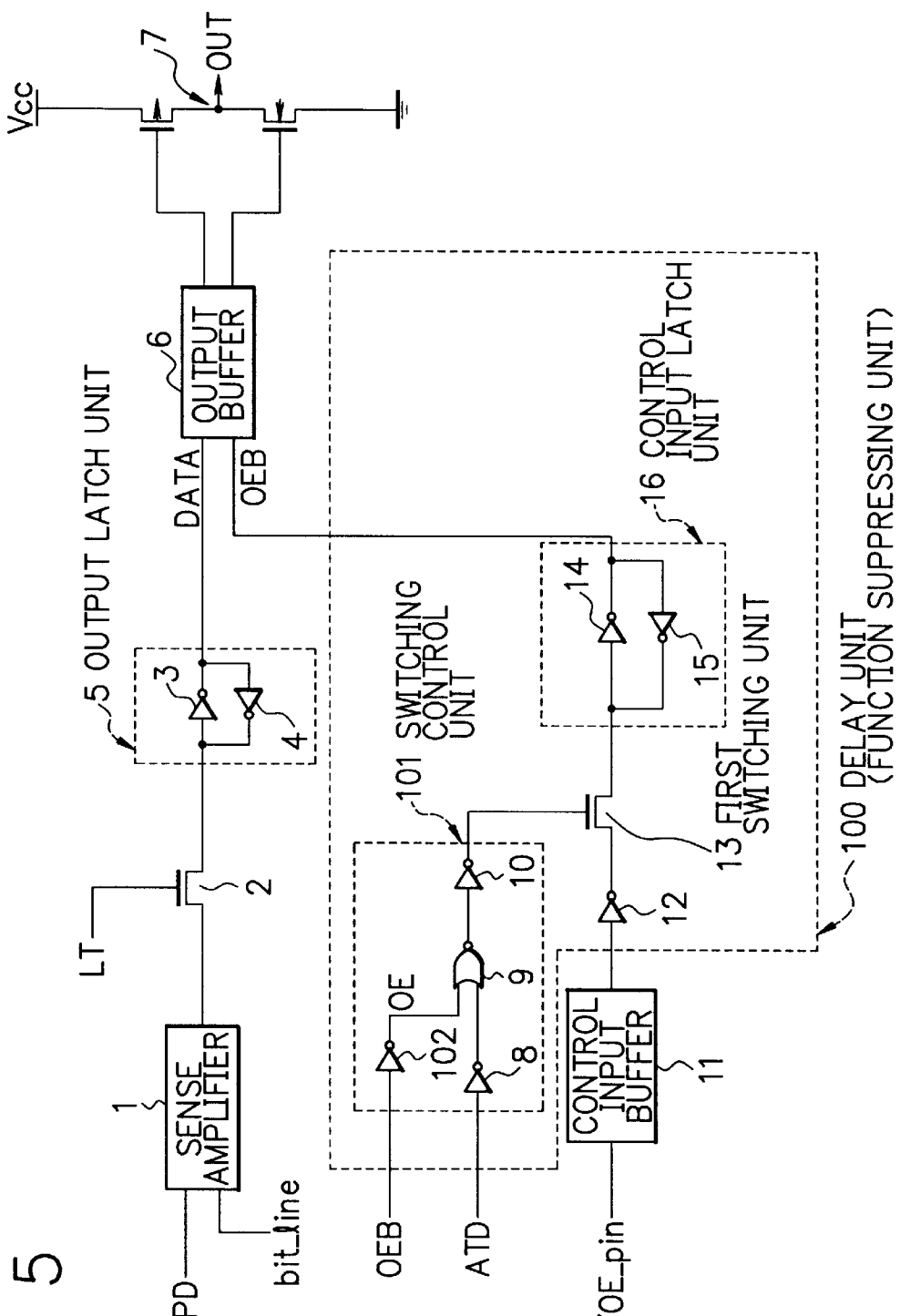
FIG. 5 is a block diagram showing the first embodiment of an output signal control circuit according to the present invention.

FIG. 5 is a block diagram showing the first embodiment of an output signal control circuit used in a semiconductor memory according to the present invention. In FIG. 5, the same reference numerals as in FIG. 1 denote the same parts as in FIG. 1, and a detailed description thereof will be omitted.

As shown in FIG. 5, the output signal control circuit according to the first embodiment comprises a sense amplifier 1, a switching transistor 2, a latch circuit (output latch unit) 5 made up of inverters 3 and 4, an output buffer 6, a CMOS inverter 7, and a control input buffer 11.

A switching transistor 13 constituting first switching unit is interposed between the control input buffer 11 and output buffer 6. The gate of the switching transistor 13 is connected to an inverter 8, a NOR circuit 9 and an inverter 10 for inverting an output from the NOR circuit 9, constituting a circuit for transferring an address change detection signal ATD. The input terminal of the NOR circuit 9 receives an output signal from the inverter 8 and a signal OE obtained by an inverter 102 inverting an output buffer control signal OEB input to the output buffer 6.

The output signal control circuit further comprises an inverter 12 for inverting an output from the control input buffer 11 which buffers an output control signal /OE externally input via a control signal input terminal /OE_pin, and a latch circuit 16 which is made up of inverters 14 and 15 for latching an output from a switching transistor 13 and constitutes control input latch unit.

The inverter 8, NOR circuit 9, and inverters 10 and 102 constitute switching control unit 101. The switching control unit 101, inverter 12, switching transistor 13, and latch circuit 16 constitute delay unit (i.e., function suppressing unit for the output buffer 6) 100.

The operation of the output signal control circuit according to the first embodiment having the above arrangement will be explained with reference to the timing chart of FIG. 6.

Figure 6:
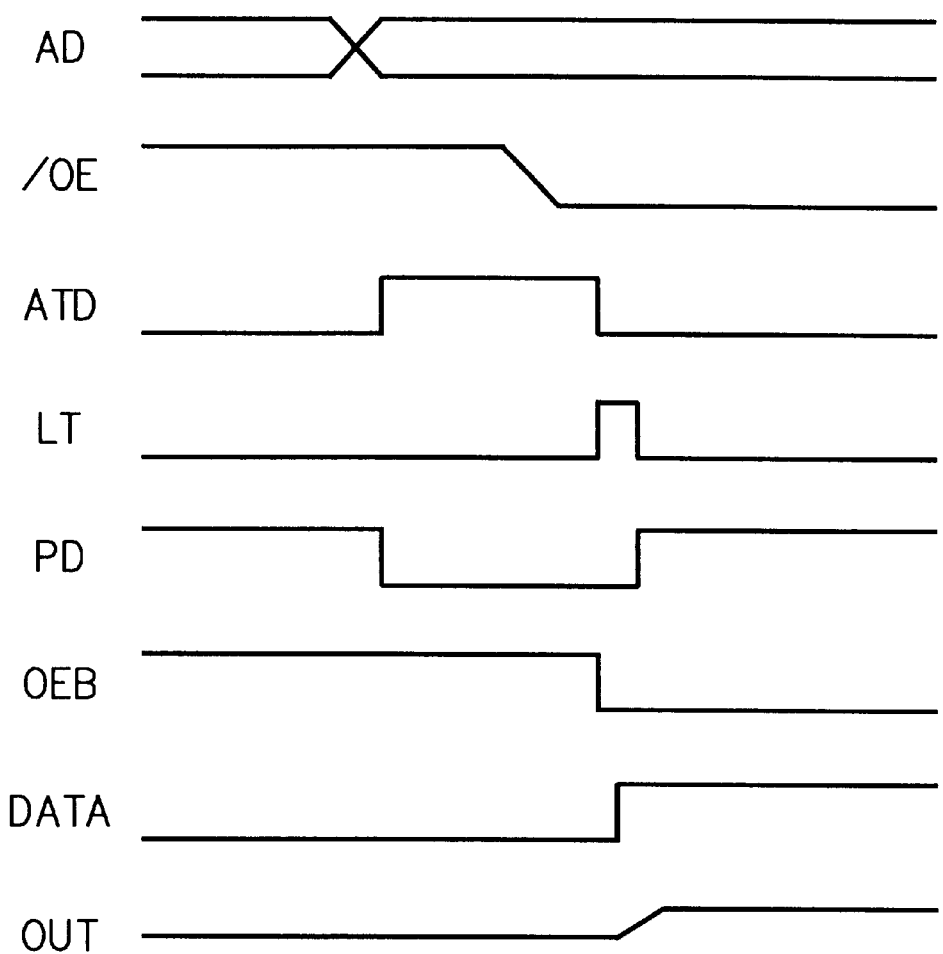
FIG. 6 is a timing chart for explaining the operation of the output signal control circuit according to the first embodiment.

When an address AD changes, as shown in FIG. 6, this change is detected by an address change detection circuit 55 (to be described later), and the address change detection signal ATD changes to "H" level for a predetermined period. Note that the address change detection signal ATD is kept at "H" level until sense operation of the sense amplifier 1 ends.

When the address change detection signal ATD changes to "H" level, a sense amplifier operation signal PD supplied to the sense amplifier 1 changes to "L" level, and the sense amplifier 1 senses an output from a cell corresponding to the new address connected to a bit line.

At the timing at which the address change detection signal ATD changes to "L" level, the address change detection circuit 55 outputs a sense data reception signal LT and supplies it to the switching transistor 2. At this time, the sense amplifier operation signal PD changes to "H" level.

Upon receiving the sense data reception signal LT, the switching transistor 2 is turned on. Sense data DATA of the sense amplifier 1 is latched by the latch circuit 5 constituting output latch unit, and supplied to the output buffer 6. The sense data DATA supplied to the output buffer 6 is output to the outside as an output signal OUT via the CMOS inverter 7.

The output buffer 6 is in an enable state when the output buffer control signal OEB supplied to its control input terminal is at "L" logic level.

In the prior art, when the output control signal /OE is externally input via the control signal input terminal /OE_pin during data sense operation of the sense amplifier 1, the output buffer 6 changes to an enable state during data sense operation of the sense amplifier 1 depending on the input timing, and the output signal OUT may be inverted.

A transistor constituting the output buffer 6 has a high driving capability to drive an external load. If the output signal OUT is inverted, the power supply potential greatly varies to generate large output noise. Data sensed by the sense amplifier 1 is destroyed, and erroneous data is undesirably latched by the latch circuit 5.

To solve this problem, the first embodiment interposes the delay unit 100 between the control input buffer 11 and output buffer 6, as described above. The delay unit 100 inhibits the output buffer 6 from changing to an enable state during data sense operation of the sense amplifier 1 even if the output control signal /OE is input via the control signal input terminal /OE_pin.

More specifically, one input terminal of the NOR circuit 9 receives a signal obtained by inverting the address change detection signal ATD by the inverter 8, whereas the other input terminal receives the signal OE obtained by inverting the output buffer control signal OEB by the inverter 102. An output from the NOR circuit 9 is inverted by the inverter 10 and input to the gate of the switching transistor 13. While the output buffer control signal OEB is at "H" level (signal OE is at "L" level) and the address change detection signal ATD is at "H" level, the switching transistor 13 is not turned on. Thus, an output from the control input buffer 11 is not transferred to the latch circuit 16.

Regardless of the input timing of the output control signal /OE, the output buffer 6 is inhibited from changing to an enable state by an "L"-level output buffer control signal OEB during data sense operation of the sense amplifier 1 in a predetermined period after the address changes.

In FIG. 6, if the sense amplifier operation signal PD changes to "L" level, and the sense amplifier 1 performs data sense operation, the output control signal /OE falls, as shown in FIG. 6. Even in this case, the fall timing of the output buffer control signal OEB is forcibly delayed until the address change detection signal ATD changes to "L" level. Thus, the output buffer 6 does not change to an enable state during data sense operation of the sense amplifier 1.

When the time elapsed until the output control signal /OE is input after the address AD changes is short, the output signal control circuit of the first embodiment prolongs the delay time until the output buffer control signal OEB is output after the output control signal /OE is input. When the elapsed time is long, this circuit shortens the delay time.

When the address change detection signal ATD changes to "L" level upon the lapse of a predetermined time after the address AD changes, the voltage level applied to the gate of the switching transistor 13 changes to "H" level to turn on the switching transistor 13. An output from the control input buffer 11 is transferred to and latched by the latch circuit 16, the output buffer control signal OEB changes to "L" level, and the output buffer 6 changes to an enable state.

As is apparent from the timing chart of FIG. 6, when the output buffer control signal OEB is at "L" level, the switching transistor 13 is ON. In this state, the logic level of the output control signal /OE input via the control signal input terminal /OE_pin changes to "H" level. Since the switching transistor 13 is ON, the output buffer control signal OEB instantaneously changes to "H" level to change the output buffer 6 to a disable state (function-suppressed state). Thus, the ON state can instantaneously change to the OFF state without any delay.

In the first embodiment, a signal obtained by inverting the output buffer control signal OEB by the inverter 102 is supplied as the signal OE supplied to the other input terminal of the NOR circuit 9. Alternatively, the signal OE input to the input point of the latch circuit 16 may be supplied. In this case, the inverter 102 can be omitted.

The second embodiment of an output signal control circuit according to the present invention will be described.

Figure 7:
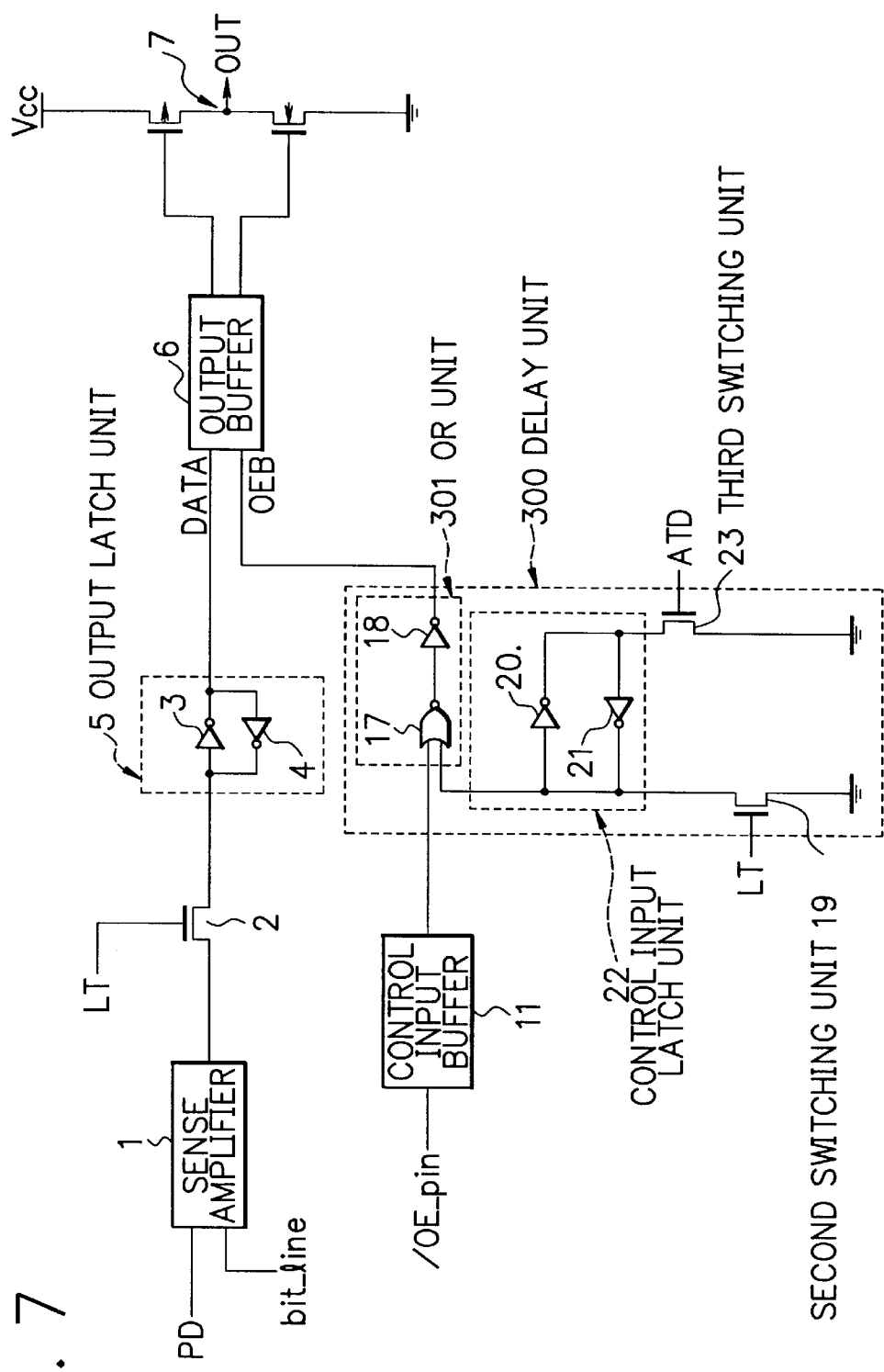
FIG. 7 is a block diagram showing the second embodiment of an output signal control circuit according to the present invention.

FIG. 7 is a block diagram showing the arrangement of the output signal control circuit according to the second embodiment of the present invention. In FIG. 7, the same reference numerals as in FIGS. 1 and 5 denote the same parts as in FIGS. 1 and 5, and a detailed description thereof will be omitted.

In the second embodiment, a NOR circuit 17 and an inverter 18 constituting OR unit 301 are interposed between a control input buffer 11 and an output buffer 6. One input terminal of the NOR circuit 17 receives an output from the control input buffer 11. The other input terminal of the NOR circuit 17 receives an output from a latch circuit 22 made up of inverters 20 and 21, constituting a control input latch unit.

One side of the latch circuit 22 is grounded through a switching transistor 19 constituting second switching unit, and the gate of the switching transistor 19 receives a sense data reception signal LT.

The other side of the latch circuit 22 is grounded through a switching transistor 23 constituting third switching unit, and the gate of the switching transistor 23 receives an address change detection signal ATD. The NOR circuit 17, inverter 18, latch circuit 22, and switching transistors 19 and 23 constitute delay unit 300.

Figure 8:
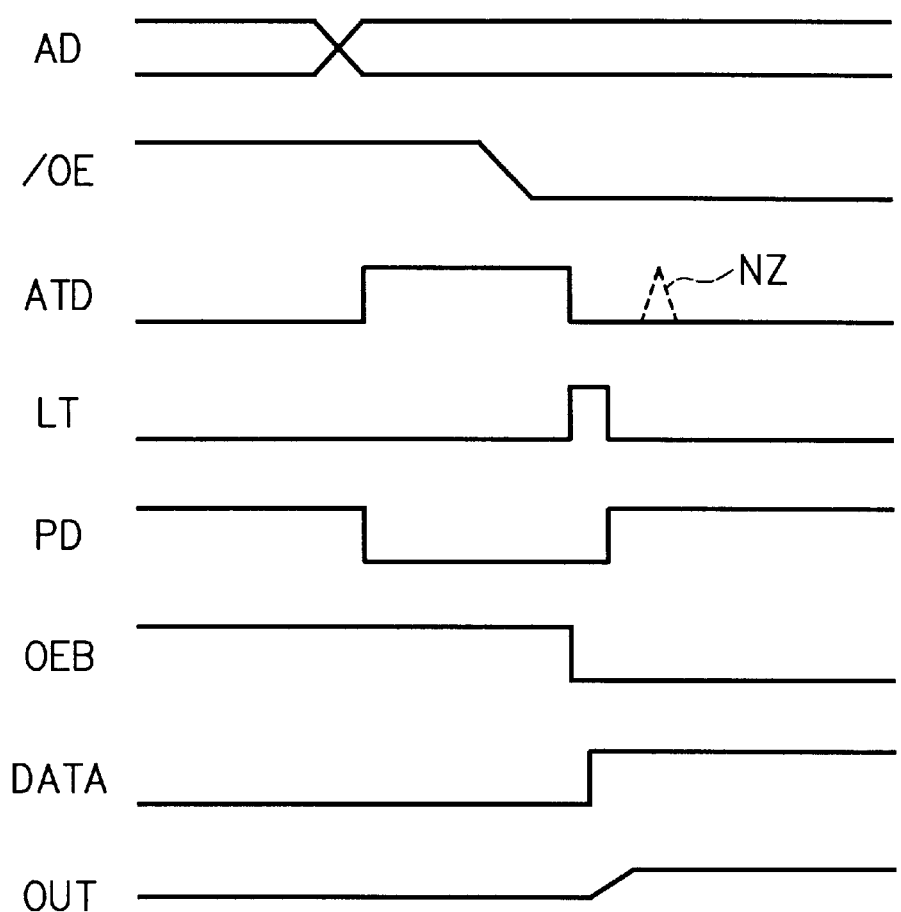
FIG. 8 is a timing chart for explaining the operation of the output signal control circuit according to the second embodiment.

In the output signal control circuit of the second embodiment having this arrangement, when an address AD changes to change the address change detection signal ATD to "H" level, as shown in the timing chart of FIG. 8, the other side of the latch circuit 22 is grounded to hold "H" level. An output buffer control signal OEB changes to "H" level, and the output buffer 6 forcibly changes to a disable state. After that, sense operation by a sense amplifier 1 ends, the address change detection signal ATD changes to "L" level, and the sense data reception signal LT changes to "H" level. Then, the holding level of the latch circuit 22 changes to "L" level to transfer an output from the control input buffer 11 to the output buffer 6.

Also in the second embodiment of the output signal control circuit, even if the address change detection signal ATD changes to "H" level to change an output control signal /OE to "L" level during data sense operation of the sense amplifier 1, inversion of an output signal OUT from the output buffer 6 can be sufficiently prevented to suppress generation of output noise.

The second embodiment in FIG. 7, however, may suffer the following malfunction depending on applications.

More specifically, when given noise like NZ shown in FIG. 8 is superposed on the address change detection signal ATD after the output signal OUT is output, the switching transistor 23 is turned on. The latch signal of the latch circuit 22 is then inverted, and an "H"-level signal latched by the latch circuit 22 is input to the other input terminal (lower input terminal) of the NOR circuit 17.

Then, the output buffer control signal OEB changes to "H" level, the output buffer 6 changes to a disable state (inactive state), and the output signal OUT becomes indefinite. In particular, if noise is superposed on the address change detection signal ATD immediately after the output signal OUT is output, the output signal OUT cannot be read by an external device.

Figure 9:
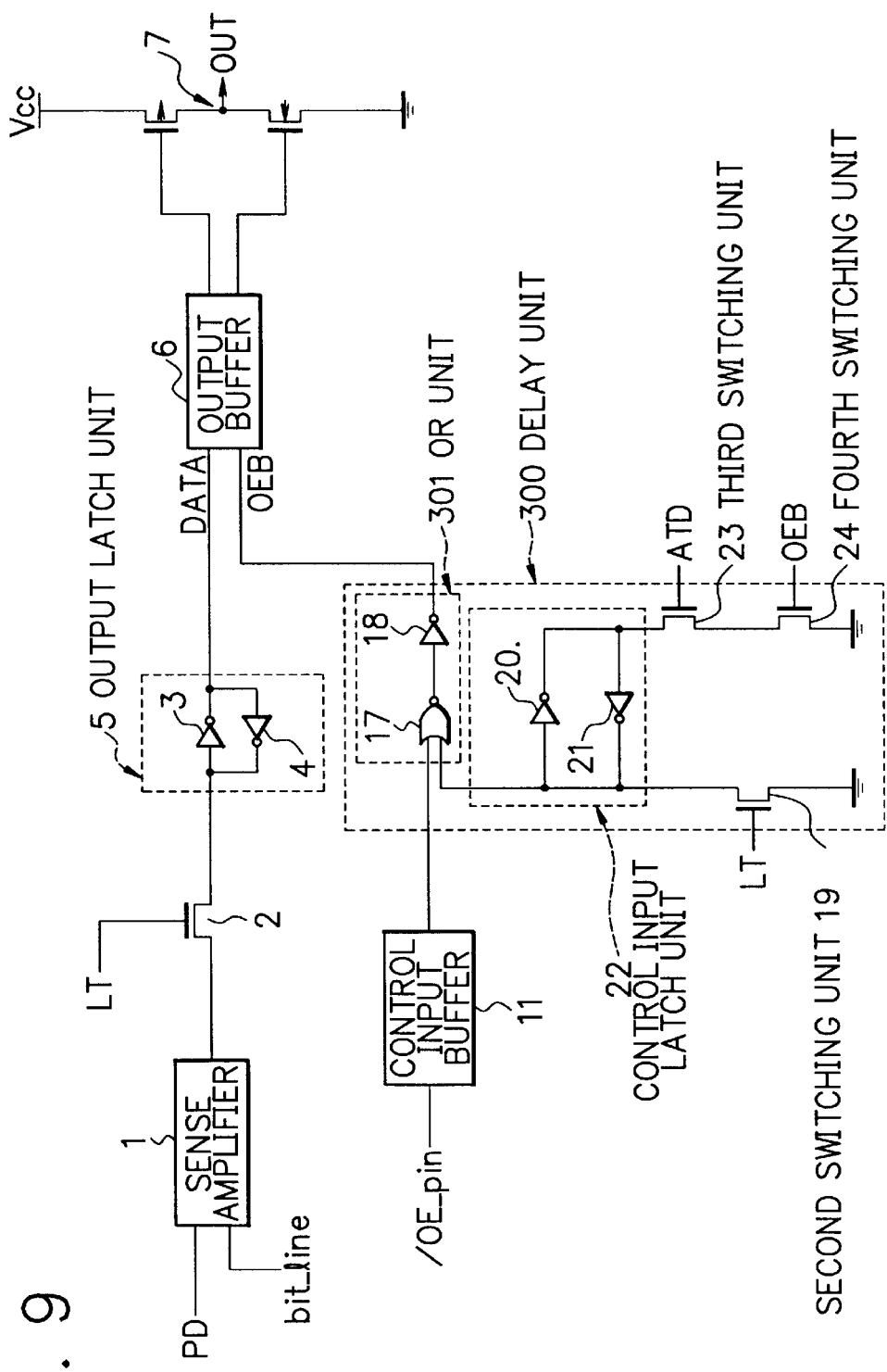
FIG. 9 is a block diagram showing the third embodiment of an output signal control circuit according to the present invention.

The third embodiment of the present invention for solving this problem is shown in FIG. 9.

In the circuit shown in FIG. 9, a switching transistor (fourth switching unit) 24 which is OFF while an output buffer 6 is in an enable state (active state) is interposed between ground and a switching transistor 23 serving as the third switching unit in FIG. 7. So long as an output buffer control signal OEB is at "L" level, the switching transistor 24 is OFF. Even if noise is superposed on an address change detection signal ATD, no latch signal of a latch circuit 22 is inverted. That is, even if the noise NZ is superposed on the address change detection signal ATD while the output buffer control signal OEB is at "L" level and the output buffer 6 is in an enable state, the output buffer 6 does not change to a disable state. The above-described problem can be effectively solved.

Figure 10:
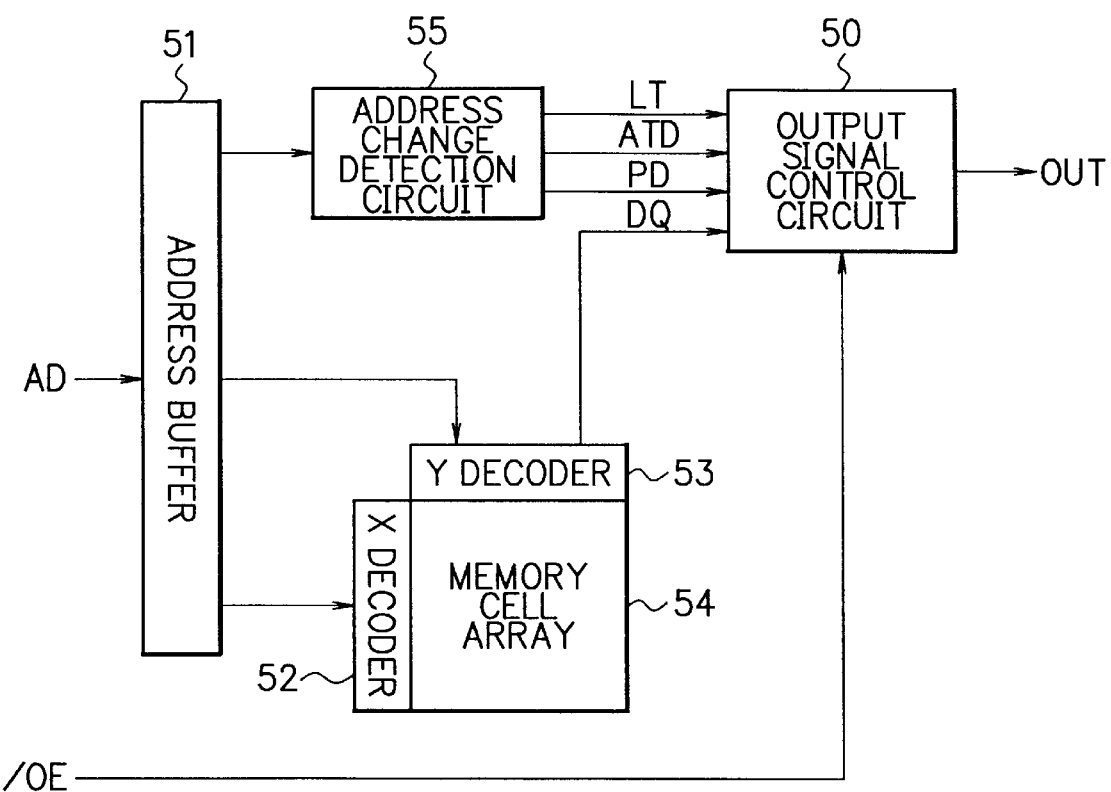
FIG. 10 is a block diagram showing the first embodiment of a semiconductor memory according to the present invention.

FIG. 10 is a block diagram showing the main arrangement of a semiconductor memory to which an output signal control circuit 50 shown in FIG. 5, 7, or 9 is applied. As is apparent from FIG. 10, this semiconductor memory comprises an output signal control circuit 50, an address buffer 51, an X decoder 52, a Y decoder 53, a memory cell array 54, an address change detection circuit 55, etc. The output signal control circuit 50 receives an output control signal /OE which is externally input through a control signal input terminal /OE_pin (not shown).

In this arrangement, when a read address AD is externally input, it is supplied to the X decoder 52 and Y decoder 53 via the address buffer 51 and also to the address change detection circuit 55. Specific cells in the memory cell array 54 are sequentially selected based on the input address AD decoded by the X decoder 52 and Y decoder 53.

Data DQ stored in a selected cell is read out to a bit line, and amplified and sensed by the sense amplifier 1.

When the address AD changes, the address change detection circuit 55 generates a sense data reception signal LT, an address change detection signal ATD, and a sense amplifier operation signal PD, and supplies them to the output signal control circuit 50. Using these signals, the output signal control circuit 50 performs the above-described output signal control reliably to prevent output noise generated by variations in power supply voltage during data sense operation of the sense amplifier 1.

The output control signal /OE is delayed in the above manner. In the semiconductor memory of this embodiment, the level of the output signal OUT output from the output buffer 6 can be prevented from varying during data sense operation of the sense amplifier 1. Therefore, it can be reliably prevented to output erroneous data by the malfunction of the sense amplifier 1 or the like owing to output noise generated by variations in power supply potential during data sense operation of the sense amplifier 1.

The fourth embodiment of an output signal control circuit according to the present invention will be described with reference to the block diagram in FIG. 11.

Figure 3:
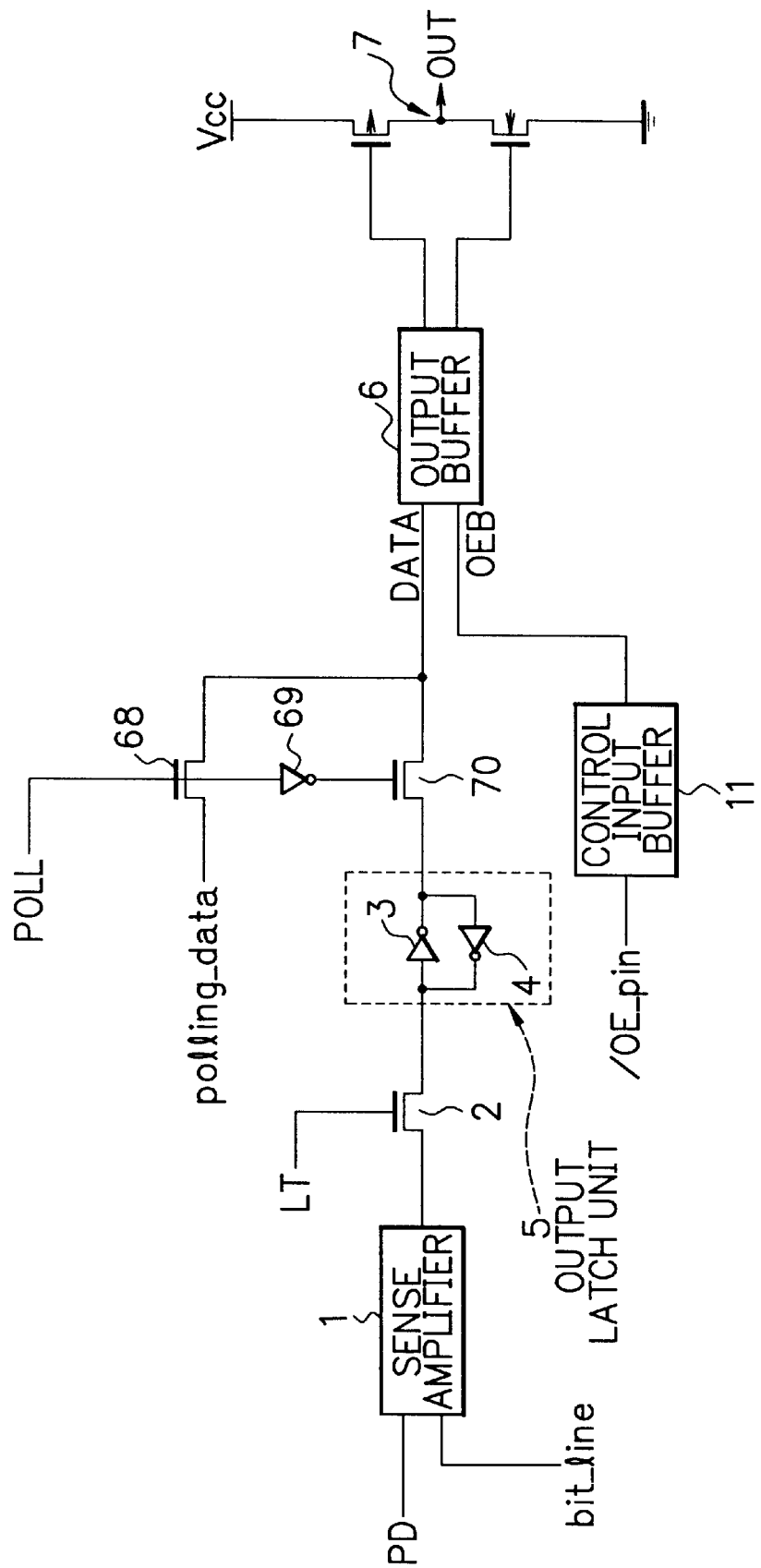
FIG. 3 is a block diagram showing the second prior art of an output signal control circuit.
Figure 4:
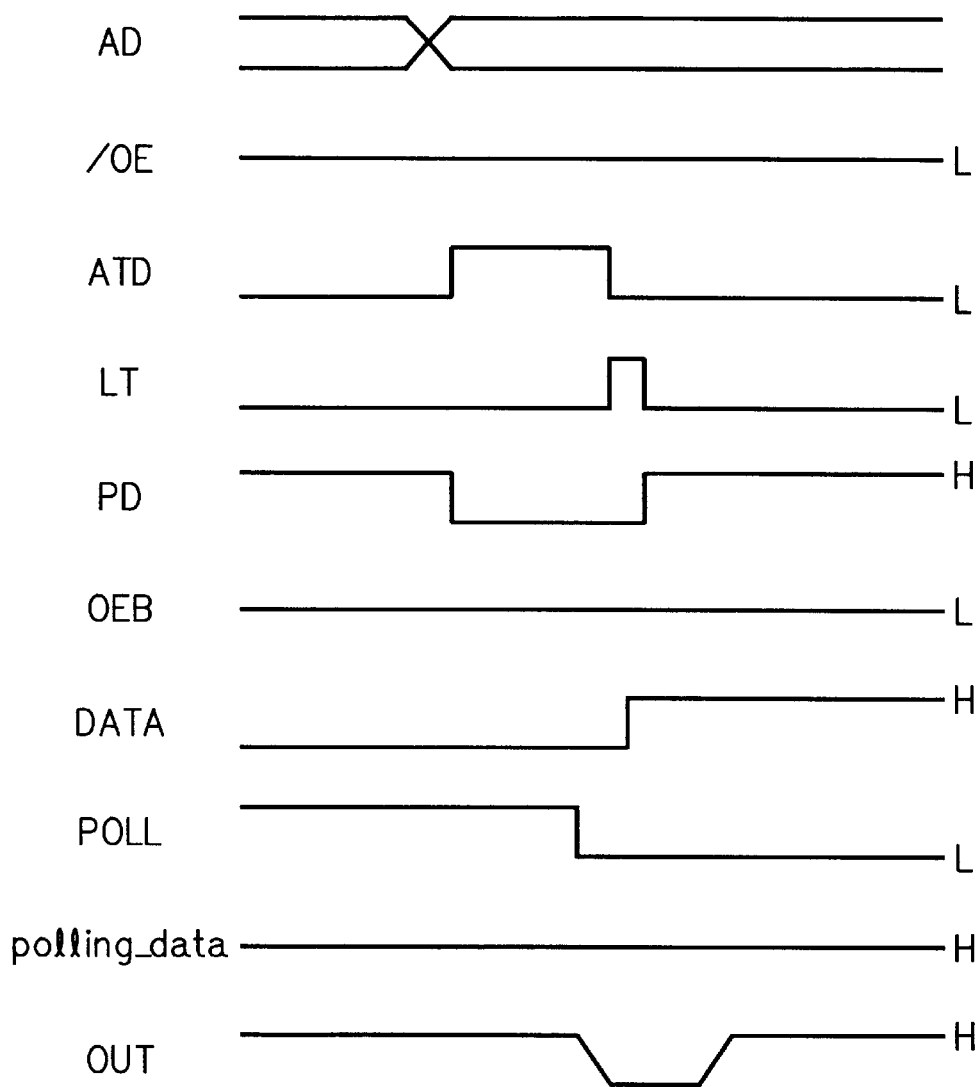
FIG. 4 is a timing chart showing the operation of the output signal control circuit according to the second prior art.

The fourth embodiment inhibits an output signal OUT from changing by switching polling data and read data during data sense operation of a sense amplifier 1 in a flash memory. In FIG. 11, the present invention is applied to the output signal control circuit in FIG. 3. The same reference numerals as in FIG. 3 denote the same parts as in FIG. 3, and a detailed description thereof will be omitted.

In the fourth embodiment, an inverter 64, a switching transistor 63, and a latch circuit 67 made up of inverters 65 and 66 are incorporated in a circuit for transferring an operation switching signal POLL to the gate of a transistor 68 for switching polling data and read data. An inverter 69 is interposed between the gates of the transistors 68 and 70.

The gate of the switching transistor 63 is connected to an inverter 62, and the inverter 62 is connected to a NOR circuit 61. One input terminal of the NOR circuit 61 receives an address change detection signal ATD via an inverter 60, whereas the other input terminal receives a signal POLLB which is output from the inverter 69 and input to the transistor 70. The above inverter 60 to latch circuit 67 constitute delay unit 600.

Figure 12:
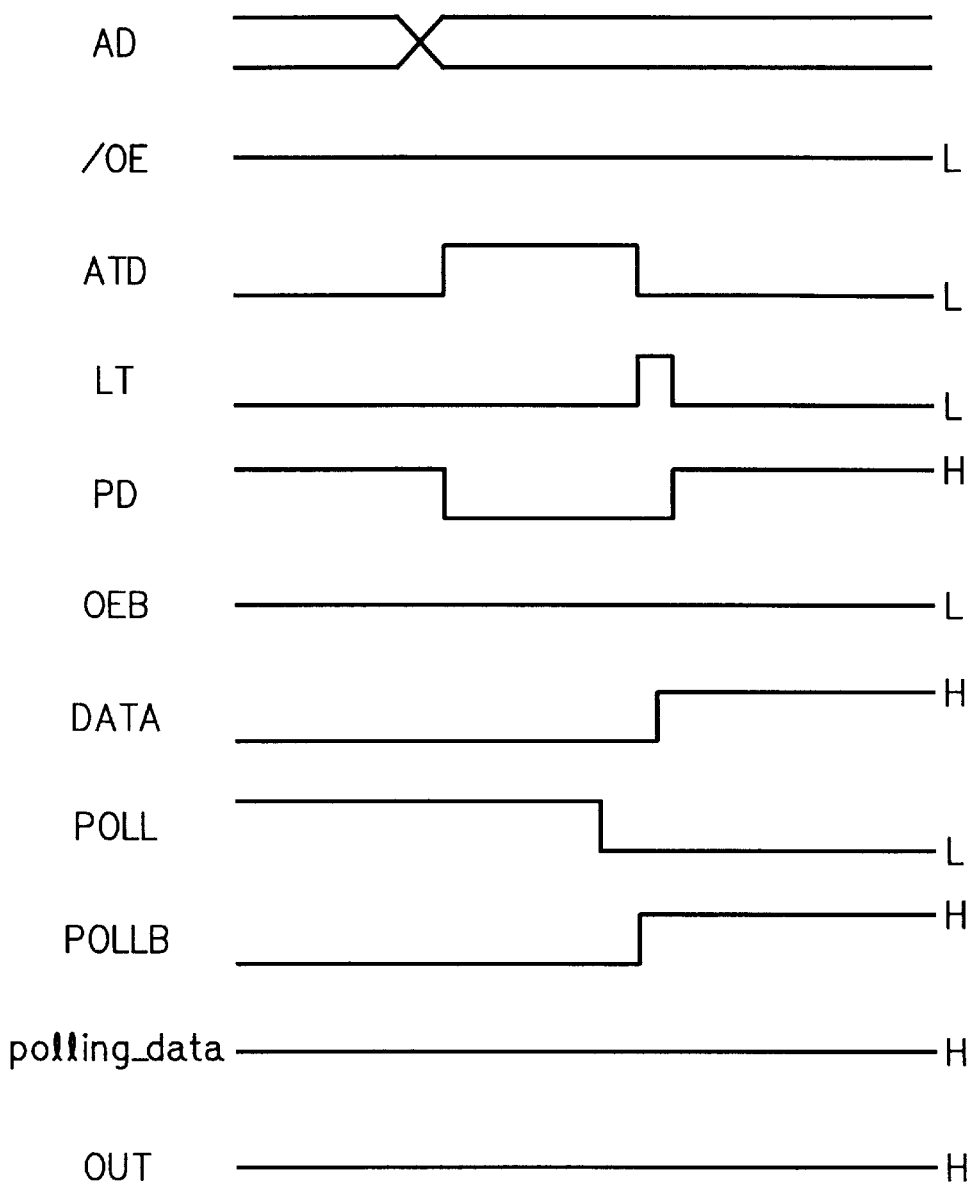
FIG. 12 is a timing chart for explaining the operation of the output signal control circuit according to the fourth embodiment.

In the output signal control circuit of the fourth embodiment having this arrangement, before a predetermined time elapses after an address AD changes for the switching signal POLL for polling data and read data in a suspend read by automatic algorithm operation of a write/erase in a flash memory, i.e., during sense operation of read data in the sense amplifier 1 ("H"-level period of the address change detection signal ATD), the signal POLLB can be delayed until the address change detection signal ATD changes to "L" level even if the operation switching signal POLL changes to "L" level, as shown in the timing chart of FIG. 12. Switching from polling data to read data can be inhibited.

More specifically, in the fourth embodiment, while the address change detection signal ATD is at "H" level, the gate application voltage is at "L" level, the switching transistor 63 is OFF, and no switching signal POLL is transferred. While the address change detection signal ATD is at "L" level, the gate application voltage is at "H" level, the switching transistor 63 is ON, and the switching signal POLL is transferred. Even if the switching signal POLL changes to "L" level during data sense operation of the sense amplifier 1, the problem can be reliably solved in which polling data and read data are switched to change the output signal OUT and erroneous data is latched by generated output noise.

Figure 11:
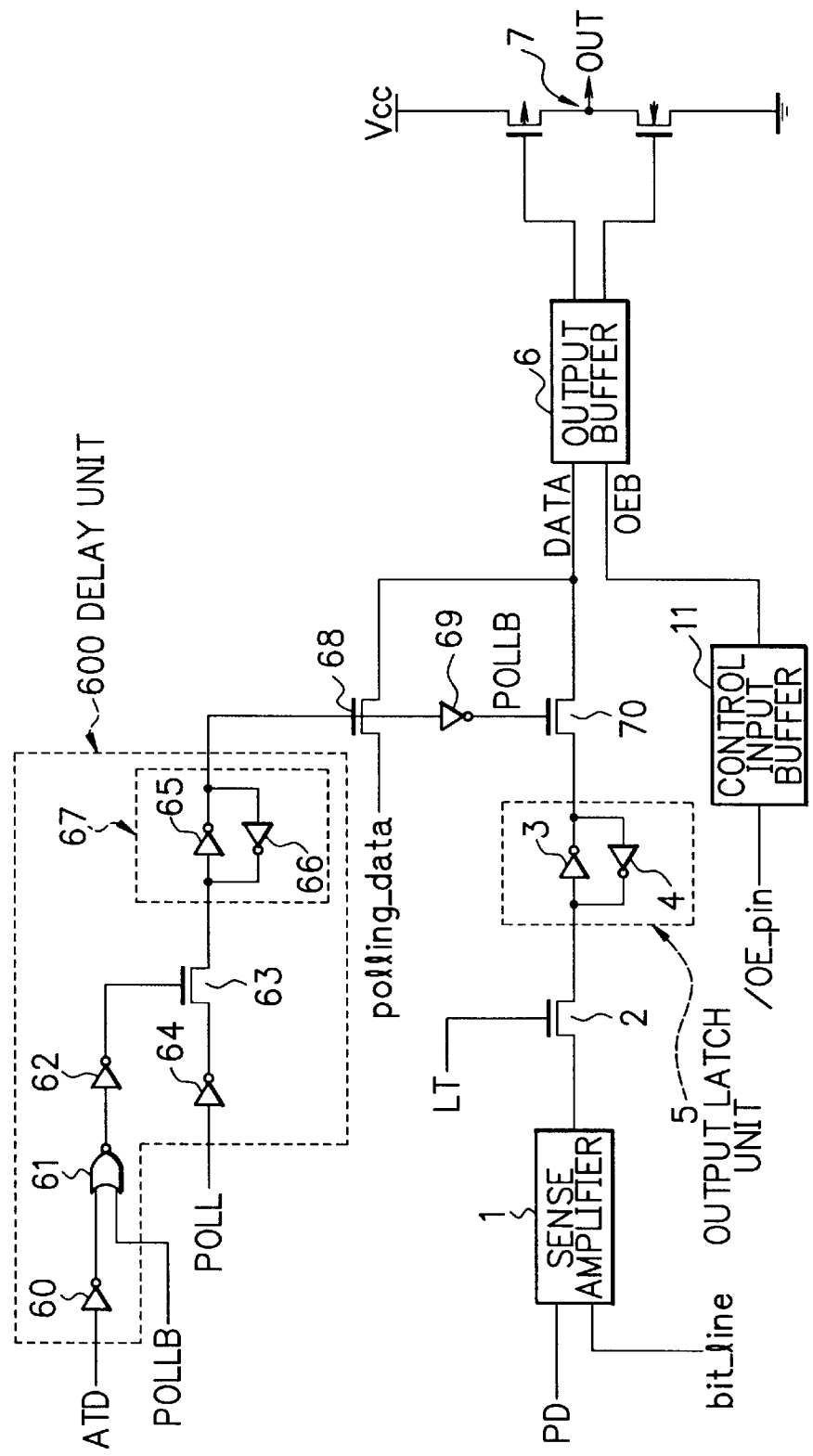
FIG. 11 is a block diagram showing the fourth embodiment of an output signal control circuit according to the present invention.

FIG. 13 is a block diagram showing the schematic arrangement of a flash memory to which an output signal control circuit 88 shown in FIG. 11 is applied. As shown in FIG. 13, this flash memory comprises a control circuit 80 having a command register, an address change detection circuit 81, an address latch circuit 82, a Y decoder 83, an X decoder 84, an enable logic circuit 85, a memory cell array 86, a Y gate circuit 87, an output signal control circuit 88, etc.

The control circuit 80 controls a write/erase in the flash memory, receives a reset signal RESET, a write enable signal WE, a chip enable signal CE, and the like, and outputs a strobe signal STB, an operation switching signal POLL, polling data, and the like. Note that the control circuit 80 controls a data write/erase in/from the memory cell array 86 on the basis of the automatic algorithm program of a data write/erase.

The address change detection circuit 81 receives the address AD. The address change detection circuit 81 detects a change in input address AD, and generates and outputs a sense amplifier operation signal PD, an address change detection signal ATD, a sense data reception signal LT, and the like.

The address latch circuit 82 latches the input address AD, and outputs the address AD to the Y decoder 83 and X decoder 84 in accordance with the strobe signal STB.

The enable logic circuit 85 receives the chip enable signal CE and output control signal OE, generates an output buffer control signal OEB based on these signals, outputs it to the output signal control circuit 88, outputs an enable signal to the Y decoder 83, and changes these circuits 88 and 83 to an enable state.

In the memory cell array 86, cells connected to one word line in the x direction are selected by the X decoder 84. Outputs from these cells are sequentially gated one by one by the Y gate circuit 87 selected by the Y decoder 83. Data DQ stored in a selected cell is read out to a bit line, and the output signal control circuit 88 performs the above-mentioned sense operation.

According to the fourth embodiment, switching to a read of a block (sector) not subjected to any erase during a sector erase in a flash memory, i.e., output switching from polling data to read data is inhibited during data sense operation of the sense amplifier 1. This can effectively prevent any malfunction caused by sense operation of erroneous data depending on the fall timing of the operation switching signal POLL.

Note that delay control of the output control signal /OE and delay control of the operation switching signal POLL are separately applied in the above-described embodiments. Alternatively, these control operations may be applied to one semiconductor memory.

The present invention can apply to various semiconductor memories such as DRAMs and flash memories.

What is claimed is:

1. A semiconductor memory comprising:
   an address change detection unit for detecting a change of an address which is externally input, and outputting an activated address change detection signal for a period until data sense operation ends after the change of the address is detected; and
   a delay unit for inhibiting an output control signal, which is externally input to control the operation of an output buffer, from being transferred to said output buffer while said address change detection signal is activated.

2. The memory according to claim 1, wherein said period during which said delay unit inhibits said output control signal from being transferred to said output buffer is set long when the time period from changing of said address to the input of said output control signal is short, and set short when the time from changing of said address to the input of said output control signal is long.

3. A semiconductor memory comprising:
   a sense amplifier for detecting data which is stored in a memory cell designated by an address which is externally input;
   an address change detection unit for detecting a change of said address which is input, and outputting an activated data reception signal in pulse form, after the change of the address is detected and data sense period of said sense amplifier elapses;
   an output latch unit for latching data detected by said sense amplifier, synchronously with said data reception signal; and
   a delay unit for inhibiting an output control signal, which is externally input to enable an output buffer, from being transferred to said output buffer until said data reception signal is activated after the change of the address is detected by said address change detection unit.

4. A semiconductor memory comprising:
   an address change detection unit for detecting a change of an address which is externally input, and outputting an activated address change detection signal for a period until data sense operation by a sense amplifier ends after the change of the address is detected; and
   a function suppressing unit for keeping an output buffer in a function-suppressed state while said address change detection signal is activated.

5. A semiconductor memory wherein data of a memory cell designated by an address is detected by a sense amplifier, the detected data is output via an output buffer, and the operation of said output buffer is controlled by an output control signal, said memory comprising:
   an address change detection unit for detecting a change of an address which is externally input, and activating an address change detection signal, which is output, for a period until data sense operation ends after the change of the address is detected; and
   a delay unit for delaying said output buffer being operated by said output control signal, with said address change detection signal for a period until said data sense operation ends.

6. The memory according to claim 5, wherein said delay unit comprises first switching unit for switching said output control signal, and switching control unit for keeping said first switching unit off till said time at which data sense operation ends.

7. The memory according to claim 5, wherein said delay unit comprises control input latch unit, first switching unit connected to one terminal of said control input latch unit to be turned on at said time at which data sense operation ends, second switching unit connected to the other terminal of said control input latch unit to be turned on in a sense period of said sense amplifier, and OR unit for receiving an output from said control input latch unit and said output buffer.

8. The memory according to claim 5, wherein said delay unit comprises control input latch unit, first switching unit connected to one terminal of said control input latch unit to be turned on at said time at which data sense operation ends, second switching unit connected to the other terminal of said control input latch unit to be turned on in a sense period of said amplifier, third switching unit connected between said second switching unit and the ground potential to be kept off while said output buffer is in an enable state, and OR unit for receiving an output from said control input latch unit and said output control signal and supplying its output to said output buffer.

9. An output signal control method in a semiconductor memory, comprising the step of delaying a signal so as to inhibit an output control signal, which is externally input to control the operation of an output buffer, from being transferred to said output buffer while a change of an address which is externally input is detected, an address change detection signal is activated and output for a period until data sense operation ends after the change of the address is detected, and said address change detection signal is activated.

10. An output signal control circuit for inhibiting an output control signal, which is externally input to control the operation of an output buffer, from being transferred to said output buffer during an address change detection signal, which is activated for a period until data sense operation ends after an address is changed, is input and said address change detection signal is activated.

11. An output signal control circuit comprising a delay unit for inhibiting an output control signal, which is externally input to enable an output buffer, from being transferred to said output buffer until a data detected by a sense amplifier is latched by output latch unit synchronously with a data reception signal being input, which is activated in pulse form, after an address is changed and data sense period of a sense amplifier elapses.

12. A semiconductor memory comprising:
    a sense amplifier for detecting data;
    an output latch unit for latching the data detected by said sense amplifier;
    an output buffer for outputting the data latched by said output latch unit;
    an address change detection unit for detecting a change of an address which is externally input, and outputting an activated address change detection signal for a period until data sense operation by said sense amplifier ends after the change of the address is detected; and
    a delay unit for inhibiting an output control signal, which is externally input to enable said output buffer, from being transferred to said output buffer while said address change detection signal is activated.

13. The memory according to claim 12, wherein said address change detection unit further outputs an activated data reception signal in pulse form, after the change of the address is detected and data sense period of said sense amplifier elapses, and
    said output latch unit latches data detected by said sense amplifier, synchronously with said data reception signal.

* * * * *